United States Patent [19]

Maijers et al.

[11] Patent Number: 4,841,410
[45] Date of Patent: Jun. 20, 1989

[54] METHOD OF ACCOMMODATING AN OBJECT WHICH CARRIES CURRENT DURING OPERATION IN A SYNTHETIC RESIN HOUSING AND A COMBINATION OF AN OBJECT WHICH CARRIES CURRENT DURING OPERATION AND A SYNTHETIC RESIN HOUSING

[75] Inventors: Andries C. Maijers; Johannus W. Weekamp; Antonius C. J. C. Van Den Ackerveken; Jan Brink, all of Eindhoven, Netherlands

[73] Assignee: U.S. Philips Corporation, New York, N.Y.

[21] Appl. No.: 116,419

[22] Filed: Nov. 3, 1987

[30] Foreign Application Priority Data

Nov. 6, 1986 [NL] Netherlands ............... 8602805

[51] Int. Cl.⁴ .................... H05K 1/04; H05F 3/02
[52] U.S. Cl. ........................... 361/306; 206/331
[58] Field of Search ............... 361/305, 328, 331, 332, 361/334, 272, 433; 206/45.14

[56] References Cited

U.S. PATENT DOCUMENTS

| 2,459,247 | 1/1949 | Skold | 206/45.14 X |
| 2,894,316 | 7/1959 | Genovese | 361/306 X |
| 2,962,638 | 11/1960 | Nieders | 206/334 X |
| 3,014,978 | 12/1961 | Lebert et al. | 361/272 X |
| 3,441,853 | 4/1969 | Bodine | 206/331 X |
| 3,806,766 | 4/1974 | Fanning | 361/433 S X |
| 4,084,210 | 4/1978 | Forrest | 206/331 X |

FOREIGN PATENT DOCUMENTS 1425958  2/1976  United Kingdom ............... 361/306

*Primary Examiner*—Donald A. Griffin
*Attorney, Agent, or Firm*—Norman N. Spain

[57] ABSTRACT

The invention relates to a method of accommodating an object which carries current during operation, in particular a capacitor which is provided with a lead in the vicinity of both facing ends, in a synthetic resin housing which is open on one side so that the object can be introduced into a space which is limited by the housing. This space is filled with a curing synthetic resin after the object has been introduced. To prevent the object from floating when the space is filled with synthetic resin, resilient members which partly surround the object are provided in the housing near the ends of the object between the object and the walls of the housing. Each resilient member comprises two legs which are each situated between one of two facing walls of the housing and the object, and which comprise angular portions whose vertices engage against the object and a wall of the housing.

8 Claims, 1 Drawing Sheet

METHOD OF ACCOMMODATING AN OBJECT WHICH CARRIES CURRENT DURING OPERATION IN A SYNTHETIC RESIN HOUSING AND A COMBINATION OF AN OBJECT WHICH CARRIES CURRENT DURING OPERATION AND A SYNTHETIC RESIN HOUSING

The invention relates to a method of accommodating an electrical element which carries current during operation, in particular a capacitor which is provided with a lead in the vicinity of both facing ends, in a synthetic resin housing which is open on one side so that the object can be introduced into a space which is limited by the housing and which is filled with a curing synthetic resin after the object has been introduced.

Such a method is described in European Patent Application No. 0083329. A problem with this method is that when the space in which the object is accommodated in the housing is filled with synthetic resin, the object tends to float because very often the specific gravity of the object is below that of the synthetic resin which is poured into the space to fix the object. To prevent this it is necessary to fix the object in the housing before the synthetic resin is introduced. A problem in this connection is that both the housing and the object are generally produced to relatively wide tolerances, consequently, the means used to fix the object in the housing must be able to compensate for these tolerances. On the other hand, in order not to hinder the insertion of the object into the housing and to avoid damage to the object and/or housing, the insertion force must not be too large.

According to the invention, resilient members which partly surround the object are provided in the housing near the ends of the electrical element between the object and the walls of the housing before the space is filled, which resilient members each comprise two legs which are each situated between one of two facing walls of the housing and the object, and which comprise angular portions whose vertices engage against the object and a wall of the housing.

In practice it has been found that thanks to the use of such resilient members an electrical element can be provided in the housing with relatively little effort, while the legs of the resilient elements, which comprise angular portions, can bridge the distances between the walls of the housing and the object within wide tolerances, thereby exerting a sufficiently large clamping force on the walls of the housing and the object to avoid floating of the object.

It is to be noted that European Patent Application No. 0083329 further discloses a method of moulding a housing which is to accommodate a capacitor, while the capacitor together with a synthetic resin filling element of U-shaped cross-section which surrounds the capacitor is introduced into a mould for forming the housing. This filling element which is provided with apertures is introduced into the mould to prevent the inclusion of air bubbles. However, the above-described method of fixing an object in a housing is not described in said publication.

The invention further relates to a combination of an electrical element which carries current during operation, in particular a capacitor, and a synthetic resin housing which comprises a space which is open on one side of the housing for the introduction of the electrical element, which space is filled with a synthetic resin, while the electrical element is provided with leads which projects from the housing.

Such a combination is known from French Patent Specification No. 2,365,192. In this known combination the object is secured to the housing by means of an L-shaped plate one leg of which is incorporated in grooves formed in the housing, and which plate is soldered to the object after the latter has been introduced into the housing. This leads to a rather complicated, relatively voluminous construction of the combination, and a manufacturing process which is time-consuming and hence expensive.

According to the invention, resilient members which partly surround the electrical element are provided between the element and the walls of the housing, near the ends of the element where leads project from the open side. These resilient members each comprise two legs which are each facing the element situated between one of two walls of the housing and the element, and which comprise angular portions whose vertices engage against the element and a wall of the housing.

When such a construction is used, a readily constructed combination consisting of a housing and an element which carries current during operation can be obtained, the fabrication of which combination is readily conceivable and economical.

The invention will now be explained in more detail with reference to the accompanying drawings.

Figure 1:
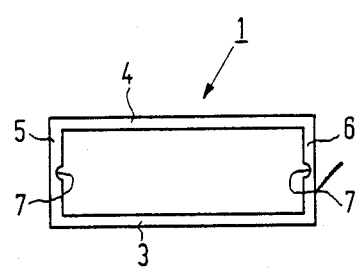
FIG. 1 is a top view of a synthetic resin housing.
Figure 2:
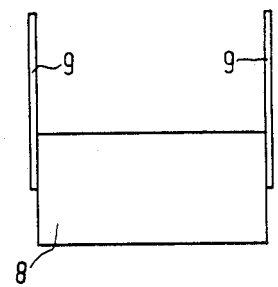
FIG. 2 is a side view of a capacitor.
Figure 3:
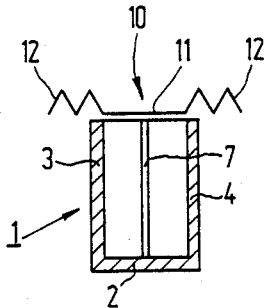
Figure 5:
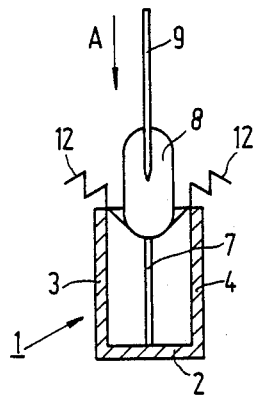
Figure 6:
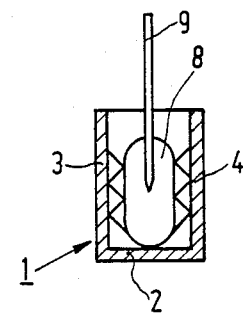
Figure 4:
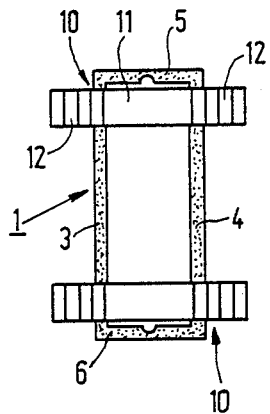

FIG. 3 is a cross-sectional view of the housing shown in FIG. 1 and of a mainly strip-like object which is situated at some distance above said housing, FIG. 4 is a top view of FIG. 3, FIG. 5 is a sectional view which corresponds substantially to that of FIG. 3, and which shows the initial stage of the introduction of an object formed by a capacitor into the housing, FIG. 6 is a sectional view, which corresponds to that of FIGS. 3 and 5, after the object has been entirely introduced into the housing.

FIG. 1 and FIGS. 3–6 show a housing 1 which in the present example has the shape of a parallelepipedum and has a bottom 2 and upwardly extending side walls 3–6 which are at right angles to said bottom. Grooves 7, which extend in the longitudinal direction of the side walls, are provided substantially in the centre of the facing sides of the short, facing side walls.

The synthetic resin housing 1 is used to accommodate an electrical which carries current during operation, which element is formed in the present example by a capacitor 8, to the facing ends of which leads 9 are attached.

As becomes apparent, in particular, from the sectional view of FIGS. 5 and 6, this capacitor has a substantially rectangular shape, and its upper and lower edges are rounded. Such a capacitor may be formed of, for example, two parallel strips which are separated by an insulating foil and wound together to form the capacitor shown in the drawing. The edges of the strip-like parts are arranged so as to be staggered with respect to each other in the direction transversely of the longitudinal direction of the strip-like parts, such that one lead 9 is connected to the edges of the one strip-like part and the other lead 9 is connected to the edges of the other strip-like part.

Such a capacitor 8 must be accommodated in the hollow space bounded by the walls 3–6 of the housing 1, such that the leads 9 are inserted in the grooves 7. After the introduction of the object, which is constituted by the capacitor 8, the hollow space is filled with a curing synthetic resin in order to fix the object 8 in the housing.

To prevent the object 8 from floating during the time that the hollow space is filled, two resilient members 10 are used. Each resilient member is formed of a central portion 11 and at the ends thereof abutting angular portions which enclose an angle with this central portion 11. In the present example four zigzag-folded portions 12 abut on each end of this central portion 11. As is shown in FIG. 3 the central portion 11 is initially flat, whilst the length of this central portion roughly corresponds to the clearance between the facing longitudinal walls 3 and 4 of the housing.

As is shown in FIG. 4, a resilient member 10 is positioned on the open upper side of the housing near each end of the housing before the object 8 is accommodated in the housing, such that the ends of the central portions 11 rest on the longitudinal walls 3 and 4. Subsequently, an object 8 is urged inside in the direction indicated by the arrow A, as shown in FIG. 5, thereby simultaneously deforming the resilient members 10 in such a way that said members 10 are substantially U-shaped by the time the member 8 has been entirely introduced into the housing 1, as shown in FIG. 6. In this position, both legs of each resilient U-shaped member, which are formed by the angular portions 12, extend between the object 8 and the longitudinal walls 3 and 4 of the housing, the example being selected so that the angular portions 12 are somewhat deformed to exert a retaining force on the object 8.

It is advantageous that the free ends of the legs which extend between the object and the walls of the housing engage against the inside of the walls 3 and 4 where they act as a kind of barbs which counteract an upward movement of the resilient member 10.

After the object 8 has been accommodated in the housing 1 by means of two clamping members 10 the house can be filled with curing synthetic resin so as to definitively secure the object 8 in the housing 1.

As the preferably metal resilient members 10 are provided near the ends of the object and do not extend over the full length of the object a short circuit between the leads 9 by the means which secure the object 8 in the housing 1 is effectively avoided.

Naturally, the housing 1 is strongest near its ends, consequently, when the resilient members are provided there, the housing will not be deformed to an objectionable degree when the hot filler material is introduced. In the filling process air can easily escape from the space which accommodates the object 8 and which is limited by the housing 1.

What is claimed is:

1. A method of stabilizing the position of an electrical element provided with a lead in the vicinity of each of two opposing ends thereof and extending outwardly away from said element, in the same general direction, in an open synthetic resin housing comprising a bottom wall portion and a continuous side wall portion extending upwardly from said bottom wall portion and, defining a space for said electrical element, with a curable synthetic resin filling introduced into space subsequent to introducing said electrical element into said housing, said method comprising introducing into said housing, prior to the introduction of said curable synthetic resin filling, two resilient members each provided with at least two angled leg portions, in a manner so as to partially surround said electrical element in the vicinity of said ends and so that at least one vertex of those defined by said angled portions is engaged against said object and at least one vertex is engaged against side wall portion of said housing.

2. The method of claim 1 wherein the element is a capacitor.

3. A method of stabilizing the position of an electrical element provided with a lead in the vicinity of each of two opposing ends thereof and extending outwardly away from said element, in the same general direction, in an open synthetic resin housing comprising a bottom wall portion and a continuous side wall portion extending upwardly from said bottom wall portion and, defining a space for said electrical element, with a curable synthetic resin filling introduced into space subsequent to introducing said electrical element into said housing, said method comprising introducing into said housing, prior to the introduction of said curable synthetic resin filling, two resilient members, each provided with at least two angled leg portions, in a manner so as to partially surround said electrical element in the vicinity of said ends and so that at least one vertex of those defined by said angled portions is engaged against said element and at least one vertex of which is engaged against the facing side wall portion of said housing and said resilient numbers being positioned transversely over the side of said housing near both ends of said space and being arranged into said space upon introduction of said element and becoming substantially U-shaped.

4. The method of claim 3 wherein each of the resilient member, prior to introduction into said space, comprise a flat portion and two angled portions abutting from said flat portion, said angled portions forming the legs when said resilient member is positioned in said space.

5. A combination of an open synthetic resin housing comprising a bottom wall portion and a continuous side wall portion extending upwardly from said bottom wall portion, said bottom wall portion and said wall position defining an open space for accommodating an electrical element provided with two leads extending outwardly from said housing in the same general direction from two opposing ends of said element and said element positioned in said space, the leads of said element projecting outwardly from said space away from said bottom wall portion and said space being filled by a cured synthetic resin characterized in that in the vicinity of each of the ends of said element from which said leads extend, a resilient, member which partially surrounds said element, contacts portions of said element between said ends and away from said leads and is provided between said side wall portion of said housing and walls of said element facing said side wall portion, said resilient member comprising two legs, each leg being situated between said element and portions of said side wall portion facing said element and each leg comprising angled portion comprising at least two vertices, at least one of which vertices engages against the element and at least one of which vertices engages against said side wall portion of said housing.

6. A combination as claimed in claim 5, characterized in that the edges of the free ends of the legs engage against the walls of the housing and extend obliquely with respect to these walls.

7. A combination as claimed in claim 5, characterized in that the leads are partly positioned in grooves provided in the walls.

8. The combination of claim 5 wherein the element is a capacitor.

* * * * *